(12) United States Patent
Ando et al.

(10) Patent No.: US 7,112,500 B2
(45) Date of Patent: Sep. 26, 2006

(54) THIN FILM TRANSISTOR, LIQUID CRYSTAL DISPLAY AND MANUFACTURING METHOD THEREOF

(75) Inventors: Masahiko Ando, Hitachinaka (JP); Masahiro Kawasaki, Hitachi (JP); Masatoshi Wakagi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/902,170

(22) Filed: Jul. 11, 2001

(65) Prior Publication Data
US 2002/0115241 A1 Aug. 22, 2002

(30) Foreign Application Priority Data
Feb. 19, 2001 (JP) ............................. 2001-042168

(51) Int. Cl.
*H01L 21/331* (2006.01)
(52) U.S. Cl. .................. 438/368; 438/482; 438/542; 438/597
(58) Field of Classification Search ................ 438/149, 438/151, 156, 482, 597, 249, 542, 783, 476, 438/96, 365, 368, 571
See application file for complete search history.

(56) References Cited
U.S. PATENT DOCUMENTS

| | | | | |
|---|---|---|---|---|
| 5,591,989 A | * | 1/1997 | Miyasaka et al. | 257/66 |
| 5,637,512 A | * | 6/1997 | Miyasaka et al. | 438/166 |
| 5,913,113 A | * | 6/1999 | Seo | 438/166 |
| 5,990,489 A | * | 11/1999 | Tashiro | 257/53 |
| 6,214,684 B1 | * | 4/2001 | Shoji | 438/308 |
| 6,214,705 B1 | * | 4/2001 | Ting | 438/482 |
| 6,391,691 B1 | * | 5/2002 | Tsujimura et al. | 438/151 |
| 6,444,508 B1 | * | 9/2002 | Tanabe et al. | 438/164 |
| 6,624,051 B1 | * | 9/2003 | Ohtani et al. | 438/486 |
| 2001/0022633 A1 | * | 9/2001 | Kwak et al. | 349/43 |

FOREIGN PATENT DOCUMENTS

| | | |
|---|---|---|
| JP | 02-050131 | 2/1990 |
| JP | 08-051211 | 2/1996 |

OTHER PUBLICATIONS

"Off Current Dependence on Farbrication Process of a Back-Channel-Etching-Type a-Si TFT" by Washizuka et al. (IDW 1997 pp. 207-210).
Nikkei Microdevices (Jun. 2000 p. 175).

* cited by examiner

*Primary Examiner*—Brook Kebede
*Assistant Examiner*—Khiem Nguyen
(74) *Attorney, Agent, or Firm*—Dickstein Shapiro LLP

(57) ABSTRACT

The present invention provides a thin film transistor comprising a drain electrode and a source electrode separated by a channel region formed over a contact portion with an amorphous silicon layer and wherein an impurity from the channel region is removed and a remaining impurity is diffused into the contact portion to form a contact layer wherein the contact layer has a second resistance at least lower than the first resistance.

30 Claims, 6 Drawing Sheets

THIN FILM TRANSISTOR, LIQUID CRYSTAL DISPLAY AND MANUFACTURING METHOD THEREOF

FIELD OF THE INVENTION

This invention relates to a thin film transistor and a manufacturing method thereof and, in particular, to a thin film transistor used as a switching element in an active matrix type liquid crystal display device and a manufacturing method thereof.

DISCUSSION OF THE RELATED ART

Channel etching type thin film transistors have been used mainly as switching elements for active matrix type liquid crystal display devices. FIGS. 6(a) to (d) illustrates a conventional channel etching type thin film transistor and a manufacturing process thereof. As shown, a glass substrate 61, a gate electrode 62, a gate insulating layer 63 made of silicon nitride (SiN), a high resistance amorphous silicon layer 64 forming a transistor active portion, a low resistance amorphous silicon layer 65 forming a contact layer, a drain electrode 66, a source electrode 67, and a protection layer 68 made of silicon nitride (SiN) are provided.

First, as shown in FIG. 6(a), the gate electrode 2 is formed on the glass substrate 1 and the gate insulating layer 63 is formed on the gate electrode 2 and on the glass substrate 1. Subsequently, the high resistance amorphous silicon layer 64 is formed on the gate insulating layer 63 and the low resistance 5 amorphous silicon layer 65 is formed on the surface of the high resistance amorphous silicon layer 64. Then, as shown in FIG. 6(b), the high resistance amorphous silicon layer 64 is selectively removed together with the low resistance amorphous silicon layer 65 by etching to form an island portion, and the drain electrode 66 and the source electrode 67 are formed on a region including both ends of the island portion.

As shown in FIG. 6(c), a portion of the high resistance amorphous silicon 64 at a channel portion between the drain electrode 66 and the source electrode 67 is removed together with the low resistance amorphous silicon layer 65 by etching (channel etching step), wherein the drain electrode 66 and source electrode 67 are used as a mask. Here, the low resistance amorphous silicon layer 65 between the drain electrode 66 and the high resistance amorphous silicon layer 64 and between the source electrode 67 and the high resistance amorphous silicon layer 64 is unetched and remains. Finally, as shown in FIG. 6(d), the protection film 68 is formed on the drain electrode 66 and the source electrode 67 and at the channel portion, and each end of the drain electrode 66 and the source electrode 67 is exposed by etching to form a channel etching type thin film transistor.

Problematically, in the known channel etching type thin film transistor described above, it is difficult to control the accuracy of the etching amount in the channel region and consequently, the thickness of the high resistance amorphous silicon layer 64 at the channel portion can vary, which causes the thin film transistor to be unstable or exhibit non-uniform characteristics. Further, if the thickness of the high resistance amorphous silicon layer 64 is increased to stabilize the characteristics of the transistor, the resistance value of the high resistance amorphous silicon layer 64 increases, lowering the amount of current by the increased resistance value when the current passing through the thin film transistor traverses the high resistance amorphous silicon layer 64.

SUMMARY OF THE INVENTION

This present invention provides a channel etched type thin film transistor having stable characteristics and exhibiting uniform characteristics.

In an object of the present invention a method of fabricating a thin film transistor is provided comprising the steps of providing a gate over a substrate, providing a gate insulating layer over the gate and the substrate, providing a silicon layer having a first resistance over the gate insulating layer and providing an impurity over the amorphous silicon layer. The invention further provides the steps of forming a drain electrode and a source electrode separated by a channel region over a contact portion with the amorphous silicon and removing the impurity from the channel region and diffusing the impurity into the contact portion to form a contact layer wherein the contact layer has a second resistance at least lower than the first resistance.

In another object of the present invention a method of fabricating a thin film transistor is provided comprising the steps of providing a gate over a substrate, providing a gate insulating layer over the gate and the substrate, providing a silicon layer having a first resistance over the gate insulating layer and providing an impurity over the amorphous silicon layer. The invention further provides the steps of etching the silicon layer utilizing a common photoresist used to form a drain electrode and a source electrode separated by a channel region over a contact portion with the amorphous silicon and removing the impurity from the channel region and diffusing the impurity into the contact portion to form a contact layer wherein the contact layer has a second resistance at least lower than the first resistance.

In yet another embodiment of the present invention a method of fabricating a thin film transistor is provided comprising the steps of providing a gate over a substrate, providing a gate insulating layer over the gate and the substrate, providing a silicon layer having a first resistance over the gate insulating layer and providing an impurity over the amorphous silicon layer. The invention further provides the steps of providing a photoresist over the impurity provided silicon layer and back exposing the photoresist utilizing the gate as a mask and developing a pattern substantially identical with that of the gate and removing the pattern and forming a drain electrode and a source electrode separated by a channel region over a contact portion with the amorphous silicon. The invention further provides removing the impurity from the channel region and diffusing the impurity into the contact portion to form a contact layer wherein the contact layer has a second resistance at least lower than the first resistance.

In another object of the present invention a thin film transistor is provided comprising a gate provided over a substrate, a gate insulating layer provided over the gate and the substrate, a silicon layer having a first resistance provided over the gate insulating layer and an impurity provided over the amorphous silicon layer. The invention further provides a drain electrode and a source electrode separated by a channel region formed over a contact portion with the amorphous silicon wherein the impurity from the channel region is removed and the impurity is diffused into the contact portion to form a contact layer wherein the contact layer has a second resistance at least lower than the first resistance.

In another object of the present invention a thin film transistor is provided comprising a gate provided over a substrate, a gate insulating layer provided over the gate and the substrate, a silicon layer having a first resistance provided over the gate insulating layer and an impurity provided over the amorphous silicon layer wherein the silicon layer is etched utilizing a common photoresist used to form a drain electrode and a source electrode separated by a channel region over a contact portion with the amorphous silicon. The invention further provides the impurity from the channel region be removed and the impurity be diffused into the contact portion to form a contact layer wherein the contact layer has a second resistance at least lower than the first resistance.

In yet another object of the present invention a thin film transistor is provided comprising a gate provided over a substrate, a gate insulating layer provided over the gate and the substrate, a silicon layer having a first resistance provided over the gate insulating layer, an impurity provided over the amorphous silicon layer. The invention further provides a drain electrode and a source electrode separated by a channel region formed over a contact portion with the amorphous silicon wherein the channel region is formed by providing a photoresist over the impurity provided silicon layer and back exposing the photoresist utilizing the gate as a mask and developing a pattern substantially identical with that of the gate and removing the pattern. Further, the invention provides the impurity from the channel region be removed and the impurity be diffused into the contact portion to form a contact layer wherein the contact layer has a second resistance at least lower than the first resistance.

In yet another object of the present invention methods of fabricating a liquid crystal display (LCD) are provided comprising the steps of providing a plurality of thin film transistors arranged on a LCD substrate in a matrix form, each of the thin film transistors being fabricated as discussed above.

In yet another object of the present invention, liquid crystal display devices are provided comprising a plurality of thin film transistors arranged on a LCD substrate in a matrix form, each of the thin film transistors comprising the elements as discussed above.

BRIEF DESCRIPTION OF THE DRAWINGS

The above advantages and features of the invention will be more clearly understood from the following detailed description which is provided in connection with the accompanying drawings.

DETAILED DESCRIPTION OF THE INVENTION

Figure 1A:
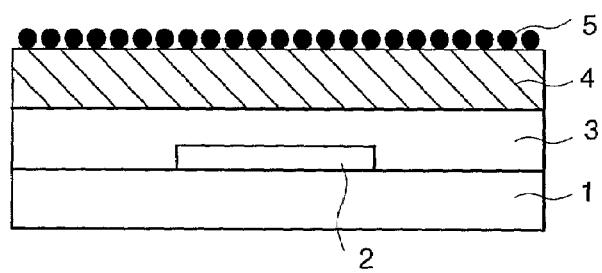
FIGS. 1(a) through 1(e) illustrate a thin film transistor and the manufacturing process thereof according to a first embodiment.

Exemplary embodiment of the present invention will be described below in connection with the drawings. Other embodiments may be utilized and structural or logical changes may be made without departing from the spirit or scope of the present invention. Although exemplary process conditions for forming various material layers are described below, these are only representative and are not meant to be considered as limiting the invention. Further, although the invention is described in terms a liquid crystal display, the invention is applicable to other semiconductor devices utilizing a thin film transistor. Like items are referred to by like reference numerals throughout the drawings.

Referring now to the drawings, FIGS. 1(a) to (e), shows a glass substrate 1, a gate electrode 2, a gate insulating film 3 comprising silicon nitride (SiN), a high resistance (<1E3 Ohm-cm) amorphous film 4 forming a transistor active portion, an impurity 5, a low resistance (>1E9 Ohm-cm) amorphous silicon film 6 forming a contact layer, a drain electrode 7, a source electrode 8 and a protection film 9 comprising silicon nitride (SiN).

As shown in FIG. 1(a), a chromium (Cr) film of about 120 nm thickness is formed by a sputtering method on the glass substrate 1 and the chromium (Cr) film is patterned by photoetching to form the gate electrode 2. Then, various layers, to be described below, are formed by using a plasma chemical vapor deposition (CVD) apparatus. That is, the gate insulating film 3 comprising silicon nitride (SiN) of 300 nm thickness is, at first formed on the gate electrode 2 by using a gas mixture such as $SiH_4$, $NH_3$ and $N_2$. Next, the high resistance amorphous silicon film 4 of about 150–200 nm thickness is formed on the gate insulating film 3 by using a gas mixture such as $SiH_4$ and $H_2$. Next, a $PH_3$ gas is decomposed by using an identical chemical vapor deposition (CVD) apparatus and the impurity 5 comprising phosphorus (P) is deposited on the surface of the high resistance amorphous silicon film 4, to obtain the constitution illustrated in FIG. 1(a) (hereinafter referred to as the first constitution). In this case, the step of forming the high resistance amorphous silicon layer 4 and the step of depositing the impurity 5 are conducted continuously while maintaining a vacuum state.

Figure 1B:
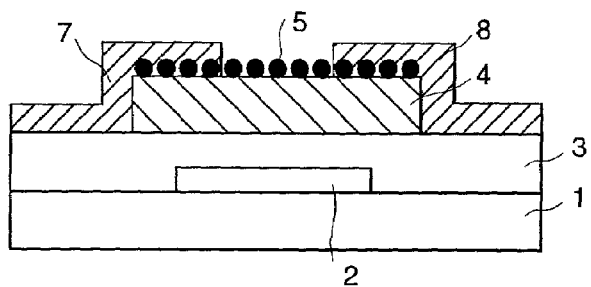

Then, as shown in FIG. 1(b), for the first constitution, an unnecessary portion of the high resistance amorphous silicon film 4 deposited with the impurity 5 is removed by a dry etching method using an etching gas such as $SF_6$ to form an island portion. Then, for example, a chromium (Cr) film of about 120 nm thickness is formed on the high resistance amorphous silicon film 4 and on the gate insulating film 3 by using a sputtering method at a room temperature. Other metals such as molybdenum (Mo) can also be utilized. The chromium (Cr) film is then patterned by photoetching, for example, by using an aqueous solution of diammonium cerium (IV) nitrate ($Ce(NH_4)_2(NO_3)_6$), thereby forming a drain electrode 7 and a source electrode 8 to obtain the constitution as shown in FIG. 1(b) (second constitution).

Figure 1C:
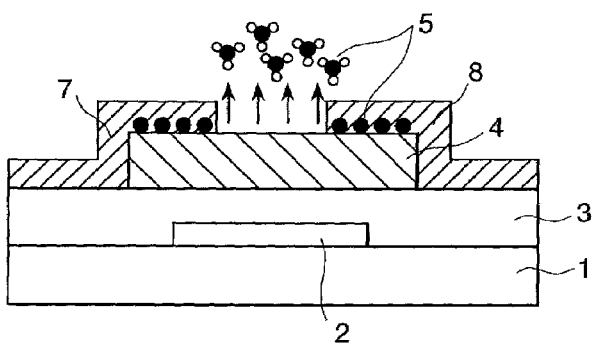

Then, as shown in FIG. 1(c), for the second constitution, the glass substrate 1 formed with the drain electrode 7 and the source electrode 8 is exposed to hydrogen plasmas for about 100–130 sec by using a plasma chemical vapor deposition (CVD) apparatus, by which the impurity 5 deposited on the surface of the high resistance amorphous silicon film 4 at the channel portion not covered with the drain electrode 7 and the source electrode 8 is removed (as $PH_3$ gas), to obtain a constitution as shown in FIG. 1(c) (third constitution).

Figure 1D:
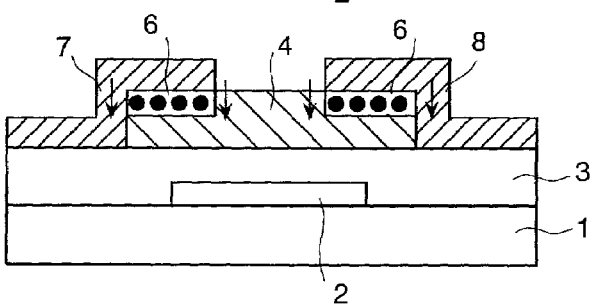

Next, as shown in FIG. 1(d), heat annealing is applied in vacuum at a temperature of about 300° C.–320° C. for about 10–15 min to the third constitution. Then, the impurity 5 comprising phosphorus (P) deposited on the surface of the high resistance amorphous silicon film 4 in contact with the drain electrode 7 and the source electrode 8 is diffused from the surface of the high resistance amorphous silicon film 4 to a depth of about 50 nm, and the contact layer 6 comprising the low resistance amorphous silicon film is formed in the high resistance amorphous silicon film 4 where the drain electrode 7 and the source electrode 8 are in contact with the high resistance amorphous silicon film 4, to obtain the constitution as shown in FIG. 1(d) (hereinafter referred to as a fourth constitution)

Figure 1E:
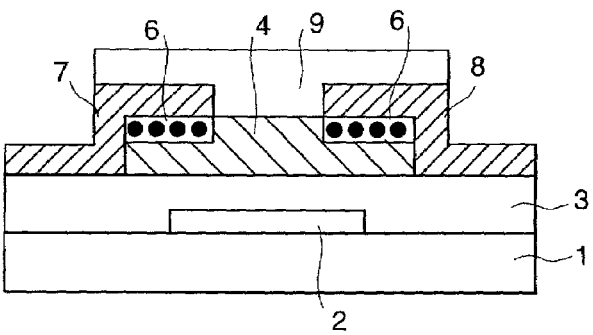

Finally, as shown in FIG. 1(e), to the fourth constitution, a protection film 9 comprising silicon nitride (SiN) of about 500 nm thickness is formed by using a gas mixture such as SiH$_4$, NH$_3$ and N$_2$ to an exposed surface portion by using a plasma chemical vapor deposition (CVD) apparatus. The thus formed silicon nitride (SiN) film is etched by a dry etching method using an etching gas such as SF$_6$ to remove an unnecessary portion and a portion of the drain electrode 7 and the source electrode 8 is exposed to complete a channel etching type thin film transistor.

Alternatively, the step of removing the impurity 5 by the hydrogen plasmas, the heat annealing step and the step of forming the protection film 9 can be conducted continuously in one identical apparatus by switching gases supplied to the plasma chemical deposition (CVD) apparatus. Further, when the protection film 9 is formed at a temperature of 300° C., since the phosphorus (P) as the impurity 5 diffuses from the surface to the inside of the high resistance amorphous silicon film 4 upon forming the protection film 9, the heat annealing step in FIG. 1(d) can be omitted.

Hence, a method of fabricating a thin film transistor is provided comprising the steps of providing a gate over a substrate, providing a gate insulating layer over the gate and the substrate, providing a silicon layer having a first resistance over the gate insulating layer and providing an impurity over the amorphous silicon layer. The invention further provides the steps of forming a drain electrode and a source electrode separated by a channel region over a contact portion with the amorphous silicon and removing the impurity from the channel region and diffusing the impurity into the contact portion to form a contact layer wherein the contact layer has a second resistance at least lower than the first resistance.

Figure 2:
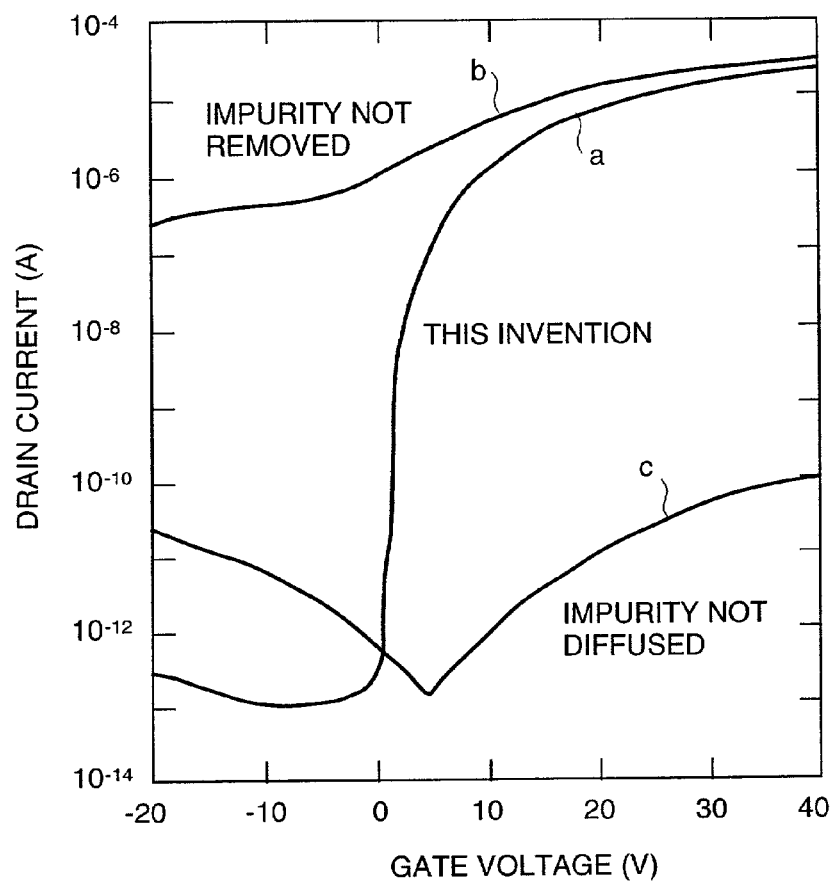
FIG. 2 is a chart illustrating the dependency of the drain current Id on the gate electrode voltage Vg (Id-Vg characteristic) exhibited by the thin film transistor of the first embodiment.

FIG. 2 is a characteristic graph showing the dependence of a drain current Id on a gate voltage Vg exhibited by dependence of the thin film transistor (Id-Vg characteristics) according to the first embodiment. In FIG. 2, the abscissa denotes the gate voltage Vg represented by V and the ordinate denotes the drain current Id represented by A in which a curve a shows a characteristic of a thin film transistor according to the first embodiment, while a curve b shows a characteristic of a thin film transistor having omitted the impurity removing step by hydrogen plasmas (Reference Example 1) and c shows a characteristic of a thin film transistor having omitted the impurity diffusing step by heat annealing (Reference Example 2). In the characteristic graphs, the application voltage between the drain and source electrodes of the thin film transistor is 10 V.

As shown by the curve a in FIG. 2, the thin film transistor according to this invention shows an abrupt switching characteristic in a case of changing the gate voltage Vg from an negative value to a positive value, and when it exceeds a turning point from the negative to a positive voltage at: Vg=0 V, the drain current Id which was at a low level abruptly increases where the ON-OFF current ratio exceeds $10^7$. However, in Reference Example 1, as shown by curve b in FIG. 2, the drain current Id shows a substantially constant value not depending on the gate voltage Vg, and no satisfactory switching characteristic can be obtained as in the transistor according to this invention. Further, as shown by the curve c in FIG. 2, Reference Example 2 shows inversion for the drain current Id from the decreasing trend to the increasing trend at the gate voltage Vg=5 V as a boundary but, again, no satisfactory switching characteristic as in the thin film transistor of this invention can be obtained.

Also, as a result of measuring the distribution of elements for the high resistance amorphous silicon film 4 including the channel portion for the thin film transistor according to this invention by using an electron beam energy loss spectroscopy (EELS) or a secondary ion mass spectroscopy MIS), it could be confined that phosphorus (P) as the impurity 5 was diffused by 0.01% or more at the depth of about 50 nm from the surface of the high resistance amorphous silicon layer 4 at a contact portion between the drain electrode 7 and the source electrode 8. This portion forms the low resistance amorphous silicon layer, that is, the contact layer 6, and the channel portion of the high resistance amorphous silicon film 4 in which the diffusion amount of the phosphorus (P) as the impurity 5 is 0.01% or less and has a cross sectional shape convexed to the contact layer 6.

Further, when the distribution of elements of the high resistance amorphous silicon film 4 including the channel portion was measured for the Reference Example 1 by using the electron beam energy loss spectroscopy (EELS) or secondary ion mass spectroscopy (MIS), the phosphorus (P) as the impurity 5 was diffused over the entire region for about 50 nm from the surface of the high resistance amorphous silicon film 4 including the channel portion.

Further, when the distribution of elements of the high resistance amorphous silicon film 4 also including a similar channel portion was measured for Reference Example 2 by using an electron beam energy loss spectroscopy (EELS) or secondary ion mass spectroscopy (MIS), phosphorus (P) as the impurity 5 was localized to the surface of the high resistance amorphous silicon film 4, and did not diffuse sufficiently to the inside of the high resistance amorphous silicon 4.

Then, in the thin film transistor according to this invention, even when the thickness for the high resistance amorphous silicon film 4 was reduced to 30 nm, the transistor characteristics did not become unstable. The changing rate of the drain current Id relative to the change of the positive gate electrode Vg increased by about three times due to the decrease of the resistance of the high resistance amorphous silicon film 4 when the drain current Id traverses the high resistance amorphous silicon film 4.

Further, when a white light at about 1000 lux was illuminated to the thin film transistor according to this invention where the thickness for the high resistance amorphous silicon film 4 was decreased to 30 nm and the light leak current was measured, the light leak current value could be reduced by about one digit. This is because the thickness of the amorphous silicon film 4 generating photo-carriers attributable to the light-leak current was lowered to about ⅕.

In the embodiment described above, explanation has been made to an example of forming a chromium (Cr) film, then patterning the chromium (Cr) film by photo-etching and forming the drain electrode 7 and the source electrode 8 upon forming the drain electrode 7 and the source electrode

8, but the drain electrode 7 and the source electrode 8 can be formed also by using an ink jet method instead of the means for forming the drain electrode 7 and the source electrode 8 described above. In other words, coating an organic medium containing fine metal particles in accordance with an electrode pattern, and evaporating the organic medium by sintering at a temperature of 300° C. for 10 min to coagulate fine metal particles. In this case, when an impurity removing step for removing phosphorus (P) as the impurity 5 from the channel portion by hydrogen plasmas is disposed between the coating step and the sintering step, the phosphorus (P) as the impurity 5 is diffused to the inside of the high resistance amorphous silicon film 4 during the sintering step and the drain electrode 7 and the source electrode 8 and the contact layer 6 can be formed simultaneously to save the heat annealing step.

Referring now to FIGS. 3(*a*) to (*e*), a thin film transistor according to a second embodiment and the manufacturing process are shown. First, as shown in FIG. 3(*a*), a chromium (Cr) film of about 120 nm thickness is formed by a sputtering method on a glass substrate 1 and the chromium (Cr) film is patterned by photoetching to form a gate electrode 2. Then, various layers, to be described below, are formed by using a plasma chemical vapor deposition (CVD) apparatus. That is, a gate insulating film 3 comprising silicon nitride (SiN) of 300 nm thickness is formed, at first, on the gate electrode 2 by using a gas mixture such as $SiH_4$, $NH_3$ and $N_2$. Next, a high resistance amorphous silicon film 4 of about 150–200 nm thickness is formed on the gate insulating film 3 by using a gas mixture such as $SiH_4$ and $H_2$. Next, a $PH_3$ gas is decomposed by using an identical chemical vapor deposition (CVD) apparatus and an impurity 5 comprising phosphorus (P) is deposited on the surface of the high resistance amorphous silicon film 4. Next, a chromium (Cr) film of about 120 nm thickness is formed on the high resistance amorphous silicon film 4 deposited with the impurity 5 to a thickness of about 120 nm by using a sputtering method to obtain the constitution illustrated in FIG. 3(*a*) (first constitution). Also in this case, the step of forming the high resistance amorphous silicon layer 4, the deposition step of the impurity 5 and the step of depositing the chromium (Cr) film are conducted continuously while keeping the vacuum state.

Then, as shown in FIG. 3(*b*), for the first constitution, an unnecessary portion of the high resistance amorphous silicon film 4 deposited with the impurity 5 and the chromium (Cr) film is removed by etching to form an island portion. Subsequently, the chromium (Cr) film corresponding to the channel portion is etched and the drain electrode 7 and the source electrode 8 are formed to obtain a constitution illustrated in FIG. 3(*b*) (second constitution).

Then, as shown in FIG. 3(*c*), for the second constitution, the glass substrate 1 formed with the drain electrode 7 and the source electrode 8 were exposed to hydrogen plasmas for about 100–130 sec by using a plasma chemical vapor deposition (CVD) apparatus and the impurity 5 deposited on the surface of the high resistance amorphous silicon film 4 in the channel portion not covered with the drain electrode 7 and the source electrode 8 is removed (as $PH_3$ gas) to obtain a constitution illustrated in FIG. 3(*c*) (third constitution).

Next, as shown in FIG. 3(*d*), heat annealing is applied in vacuum at a temperature of about 300° C.–320° C. for about 10–15 min to the third constitution, the impurity 5 comprising phosphorus (P) deposited on the surface of the high resistance amorphous silicon film 4 in contact with the drain electrode 7 and the source electrode 8 is diffused from the surface of the high resistance amorphous silicon film 4 to a depth of about 50 nm, and the contact layer 6 comprising the low resistance amorphous silicon film is formed in the high resistance amorphous silicon film 4 where the drain electrode 7 and the source electrode 8 are in contact to obtain a constitution as shown in FIG. 3 (*d*) (fourth constitution)

Finally, as shown in FIG. 3(*e*), for the fourth constitution, a protection film 9 comprising silicon nitride (SiN) of about 500 nm thickness is formed by using a gas mixture such as $SiH_4$, $NH_3$ and $N_2$ to an exposed surface portion by using a plasma chemical vapor deposition (CVD) apparatus. The silicon nitride (SiN) film formed is etched by a dry etching method using an etching gas such as $SF_6$ to remove an unnecessary portion and a portion of the drain electrode 7 and the source electrode 8 is exposed to complete a channel etching type thin film transistor.

In the second embodiment, when a photoresist having a concaved cross sectional shape in which the thickness is reduced for the channel portion and the thickness is increased on the drain electrode 7 and the source electrode 8 is used as the photoresist in the etching step shown in FIG. 3(*b*) as described, for example, in "Nikkei Microdevice" June, 2000, p 175, all etching steps can be conducted utilizing one identical or common photoresist. That is, the chromium (Cr) film and the high resistance amorphous silicon film 4 are fabricated into an island shape by using the photoresist having a concaved cross sectional shape. Then, a thin portion of the channel portion is completely removed by using the oxygen plasma to the photoresist and etching is applied leaving a thick portion on the drain electrode 7 and on the source electrode 8. Then, the chromium (Cr) film is etched by using the remaining photoresist as a mask to form the drain electrode 7 and the source electrode 8. Also in this case, each of the etching steps, the step of removing the impurity and the step of forming the protection film can be conducted while maintaining the vacuum state.

In a conventional method of manufacturing a channel etching type thin film transistor, since it is necessary to continuously conduct the steps for removing the photoresist in the channel portion, etching for the chromium (Cr) film and the channel etching, the conformability of the amount in each etching step is not satisfactory and stable transistor characteristics can not be obtained unless the thickness of the high resistant amorphous silicon film 4 is 200 nm or more. But, in the method of manufacturing the thin film transistor according to this invention, since the channel etching step is eliminated, stable transistor characteristics can be obtained even when the thickness for the high resistance amorphous silicon film 4 is reduced to 50 nm and, further, when each of the steps is conducted continuously while keeping the vacuum state, the rate of occurrence for the defects of the thin film transistor caused by deposition of obstacles suspended in atmospheric air can be minimized.

Hence, the present invention provides a method of fabricating a thin film transistor comprising the steps of providing a gate over a substrate, providing a gate insulating layer over the gate and the substrate, providing a silicon layer having a first resistance over the gate insulating layer and providing an impurity over the amorphous silicon layer. The invention further provides the steps of etching the silicon layer utilizing a common photoresist used to form a drain electrode and a source electrode separated by a channel region over a contact portion with the amorphous silicon and removing the impurity from the channel region and diffusing the impurity into the contact portion to form a contact layer wherein the contact layer has a second resistance at least lower than the first resistance.

Figure 4:
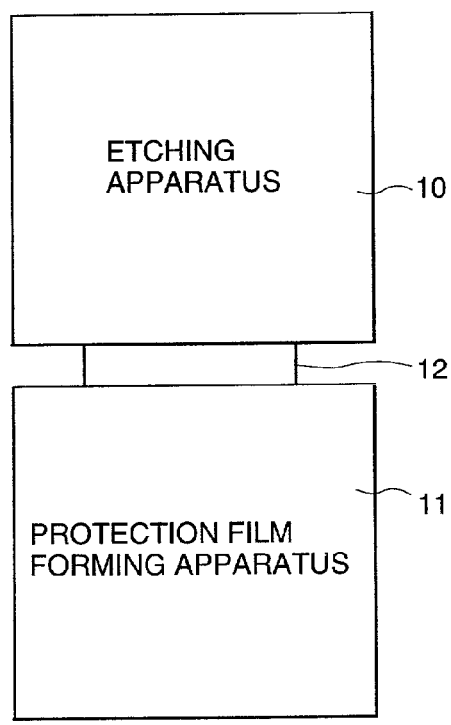
FIG. 4 illustrates a manufacturing apparatus used for manufacturing the thin film transistor according to the present invention.

FIG. 4 illustrates a manufacturing apparatus used for manufacturing the thin film transistor according to the present invention. In FIG. 4, are shown an etching apparatus 10, a protection film forming apparatus 11 and a connection mechanism 12. The etching apparatus 10 and the protection film forming apparatus 11 are combined by way of the connection mechanism 12 and the insides of both apparatus 10 and 11 and the connection mechanism 12 are kept in a vacuum state.

Figure 3A:
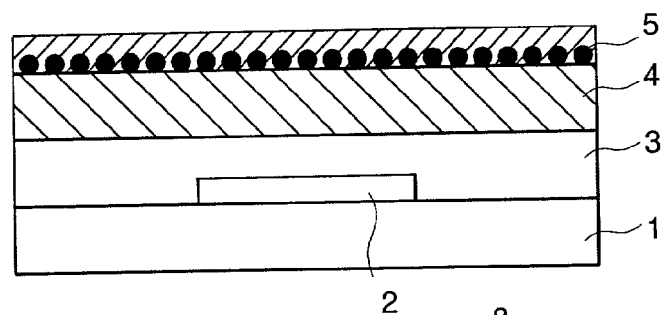
FIGS. 3(a) through 3(e) illustrate a thin film transistor and the manufacturing process thereof according to a second embodiment.

First, as shown in FIG. 3(a), the gate electrode 2 is formed on the glass substrate 1, the gate insulating film 3 is formed on the substrate 1 and on 1 0 the gate electrode 2, the high resistance amorphous silicon film 4 is formed on the gate insulating film 3, the impurity 5 is deposited on the surface of the high resistance amorphous silicon film 4, the chromium (Cr) film is formed on the high resistance amorphous silicon film 4 deposited with the impurity 5 to obtain the first constitution, and a photoresist having a concaved cross sectional shape is formed to the first constitution.

Figure 3B:
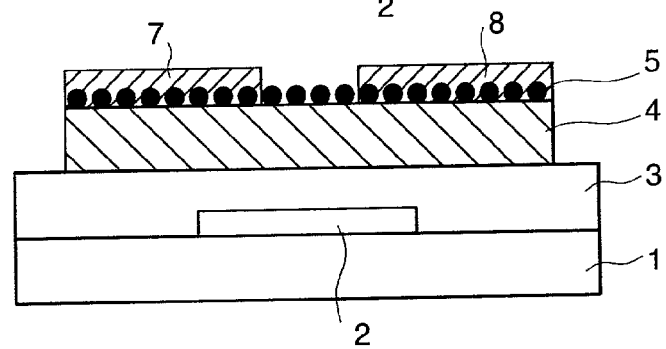
Figure 3C:
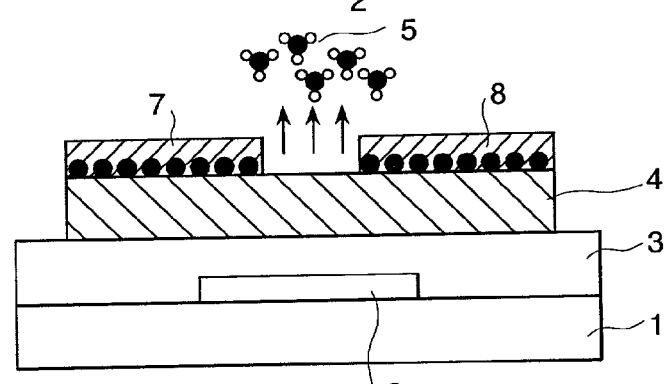
Figure 3D:
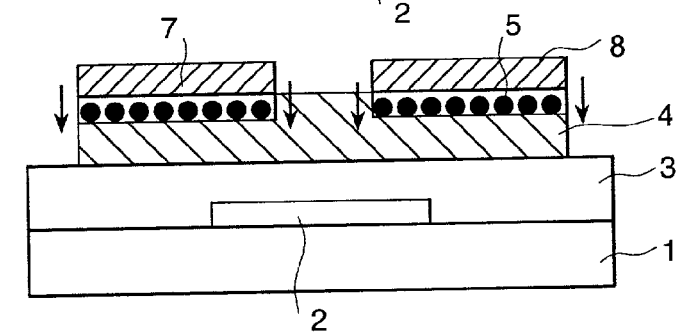
Figure 3E:
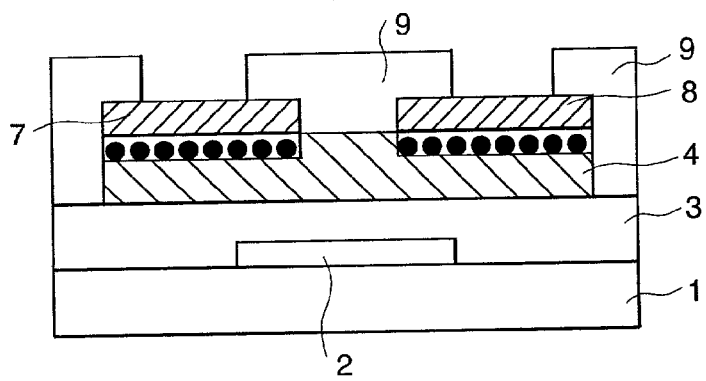

Subsequently, the first constitution formed with the photoresist is placed in the dry etching apparatus 10, gases are switched by the following procedures and the fabrication treatment for the high resistance amorphous silicon film 4, the drain electrode 7 and the source electrode 8 shown in FIG. 3(b), the treatment for removing the impurity 5 in the channel portion and the photoresist removing treatment shown in FIG. 3(c) are conducted. First, the chromium (Cr) film and the high resistance amorphous silicon film 4 are collectively fabricated by dry etching into an island shape by using a fluoro gas. Then, the photoresist is etched by using an oxygen plasma asher and the surface of the chromium (Cr) layer in the channel portion is exposed. Then, the chromium (Cr) film at the channel portion is removed by dry etching using fluoro gas again to form the drain electrode 7 and the source electrode 8. Next, a hydrogen gas is introduced to remove the impurity 5 in the channel portion. Then, the photoresist on the drain electrode 7 and on the source electrode 8 is removed by an oxygen plasma asher.

Then, the substrate 1 after the application of various kinds of treatment in the dry etching apparatus 10 is transferred from the dry etching apparatus 10 through the connection mechanism to the protection film forming apparatus 11 comprising the plasma chemical vapor deposition (CVD) apparatus while keeping the vacuum state. In the protection film forming apparatus 11, the impurity 5 is at first diffused by heat annealing to the inside of the high resistance amorphous silicon film 4 to form the contact layer 6 in the high resistance amorphous silicon film 4 at the contact portion between the drain electrode 7 and the source electrode 8. Subsequently, the protection film 9 comprising silicon nitride (SiN) is formed to the exposed portion. By using the manufacturing apparatus, since the surface of a back channel is not exposed to atmospheric air, thin film transistors having good characteristics with no deposition of suspended matters in the atmospheric air can be obtained.

Figure 5A:
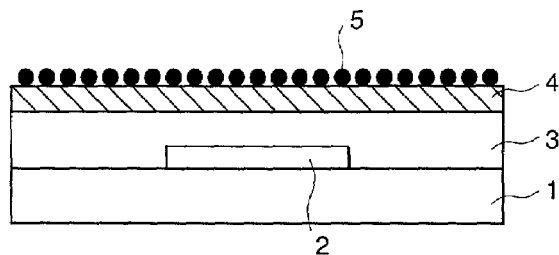
FIGS. 5(a) through 5(f) illustrate a thin film transistor and the manufacturing process thereof according to a third embodiment.

Next, FIGS. 5(a) to (f) illustrate a thin film transistor according to a third embodiment and the manufacturing process thereof. First, as shown in FIG. 5(a), a gate electrode 2 is formed on a glass substrate 1, a gate insulating film 3 comprising a silicon nitride film of 300 nm thickness is formed on the glass substrate 1 and on the gate electrode 2, a high resistance amorphous silicon film 4 of 50 nm thickness is formed on the gate insulating film 3, and then an impurity 5 comprising phosphorus (P) is deposited on the surface of the high resistance amorphous silicon film 4 while maintaining the vacuum state, to obtain the constitution shown in FIG. 5(a) (first constitution).

Figure 5B:
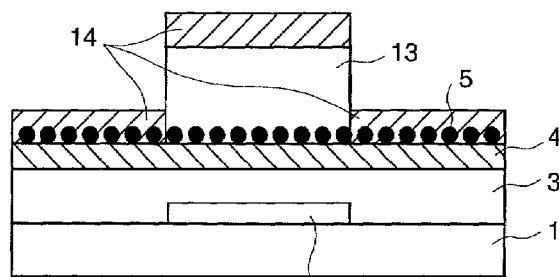

Then, as shown in FIG. 5(b), a photoresist is uniformly coated to about 2 μm thickness to the first constitution by using a spin coating apparatus. After coating the photoresist, exposure is conducted from the back side of the glass substrate 1 using the gate electrode 2 as a mask (back exposure method) followed by development to obtain a resist pattern 13 substantially identical with the pattern of the gate electrode 2. Then, a chromium (Cr) film 14 of about 120 nm thickness is formed by using a sputtering method on the resist pattern 13 and on the high resistance amorphous silicon film 4 deposited with the impurity 5 to obtain the constitution shown in FIG. 5(b) (second constitution).

Figure 5C:
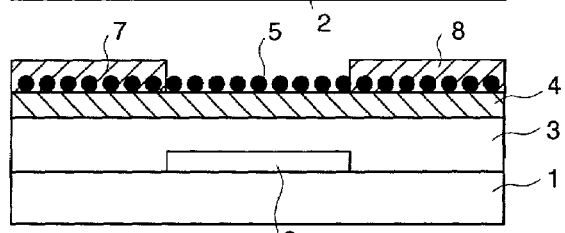

Then, as shown in FIG. 5(c), for the second constitution, the resist pattern 13 and the chromium (Cr) film 14 formed thereon are removed together by using a resist peeling liquid. Subsequently, the drain electrode 7 and the source electrode 8 are formed by fabricating the chromium (Cr) film 14 by photoetching to obtain the constitution as shown in FIG. 5(c) (third constitution). In this case, since the chromium (Cr) film 14 on the resist pattern 13 is removed together with the resist pattern 13, a self-aligned type electrode structure is obtained in which the gate electrode 2 is not overlapped with the drain electrode 7 and the source electrode 8.

Figure 5D:
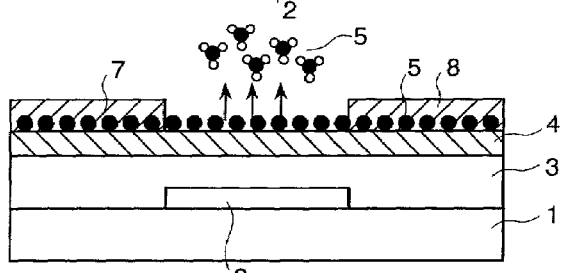
Figure 5E:
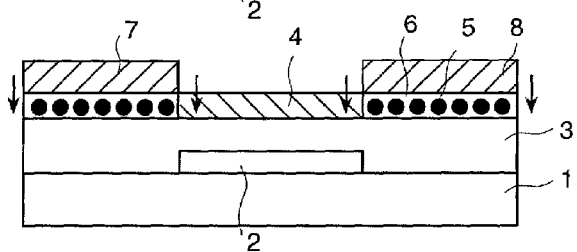
Figure 5F:
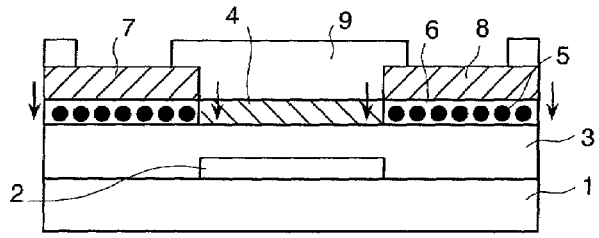
Figure 6A:
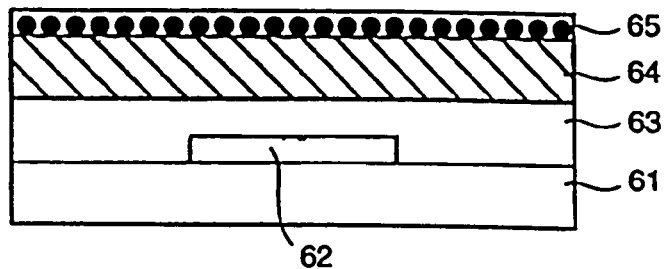
FIGS. 6(a) through 6(d) illustrate a conventional channel etched type thin film transistor and the manufacturing steps thereof.
Figure 6B:
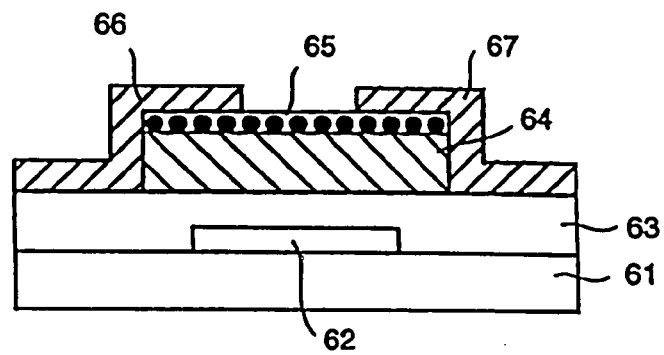
Figure 6C:
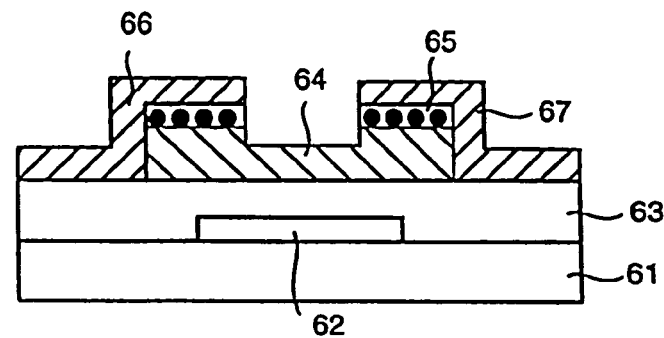
Figure 6D:
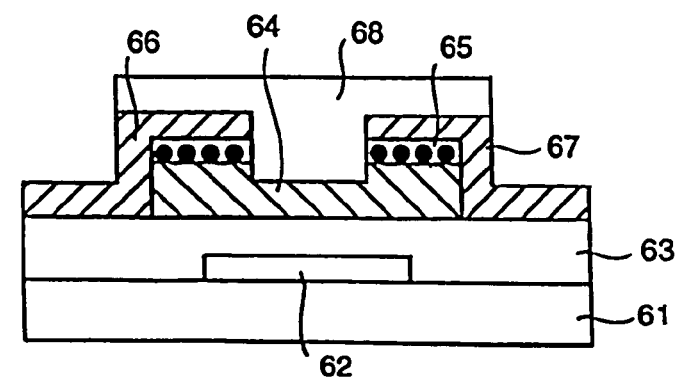

Next, as shown in FIG. 5(d), for the third constitution, the impurity 5 deposited on the surface of the high resistance amorphous silicon film 4 at the channel portion is removed by using the hydrogen plasma treatment to obtain the constitution as shown in FIG. 5(d) (hereinafter simply referred to also as a fourth constituent). Then, as shown in FIG. 5(e), for the fourth constitution, the impurity 5 deposited to the contact portion between the drain electrode 7 and the source electrode 8, and the high resistance amorphous silicon film 4 is diffused to the inside of the high resistance amorphous silicon film 4 by heat annealing, and the high resistance amorphous silicon film 4 at the diffused portion is entirely formed as a contact layer 6 comprising the resistant amorphous silicon film to obtain the constitution shown in FIG. 5(e) (fifth constitution). Then, as shown in FIG. 5(f) a protection film 9 comprising silicon nitride (SiN) of 500 nm thickness is formed to the fifth constitution by using a plasma chemical vapor deposition (CVD) apparatus and a portion of the drain electrode 7 and the source electrode 8 is exposed by etching to complete a thin film transistor.

In the thin film transistor according to the third embodiment, since the thickness for the high resistance amorphous silicon film 4 can be decreased sufficiently to 50 nm or less, the high resistance amorphous silicon film 4 does not extensively absorb exposed light and the photoresist can be exposed sufficiently. Further, in the thin film transistor according to the third embodiment, as shown in FIG. 5(e), since the impurity 5 is diffused from the contact boundary of the high resistance amorphous silicon film 4 with the source electrode 6 and the drain electrode 7 to the contact boundary with the gate insulating film 3 to form the diffused portion as the contact layer 6 comprising the low resistance amorphous silicon film, the resistance generated when the drain current traverses the high resistance amorphous silicon film 4 is reduced, and the drain current upon switching on the thin film transistor also increases. Also, in the thin film transistor according to the third embodiment, since the gate electrode 2 is not overlapped with the drain electrode 7 and the source electrode 8, a desirable capacitance is formed and it does not cause delays in the gate voltage waveform by the capacitance.

Hence, the present invention provides a method of fabricating a thin film transistor comprising the steps of providing a gate over a substrate, providing a gate insulating layer over the gate and the substrate, providing a silicon layer having a first resistance over the gate insulating layer and providing an impurity over the amorphous silicon layer. The invention further provides the steps of providing a photoresist over the impurity provided silicon layer and back exposing the photoresist utilizing the gate as a mask and developing a pattern substantially identical with that of the gate and removing the pattern and forming a drain electrode and a source electrode separated by a channel region over a contact portion with the amorphous silicon. The invention further provides removing the impurity from the channel region and diffusing the impurity into the contact portion to form a contact layer wherein the contact layer has a second resistance at least lower than the first resistance.

Figure 7:
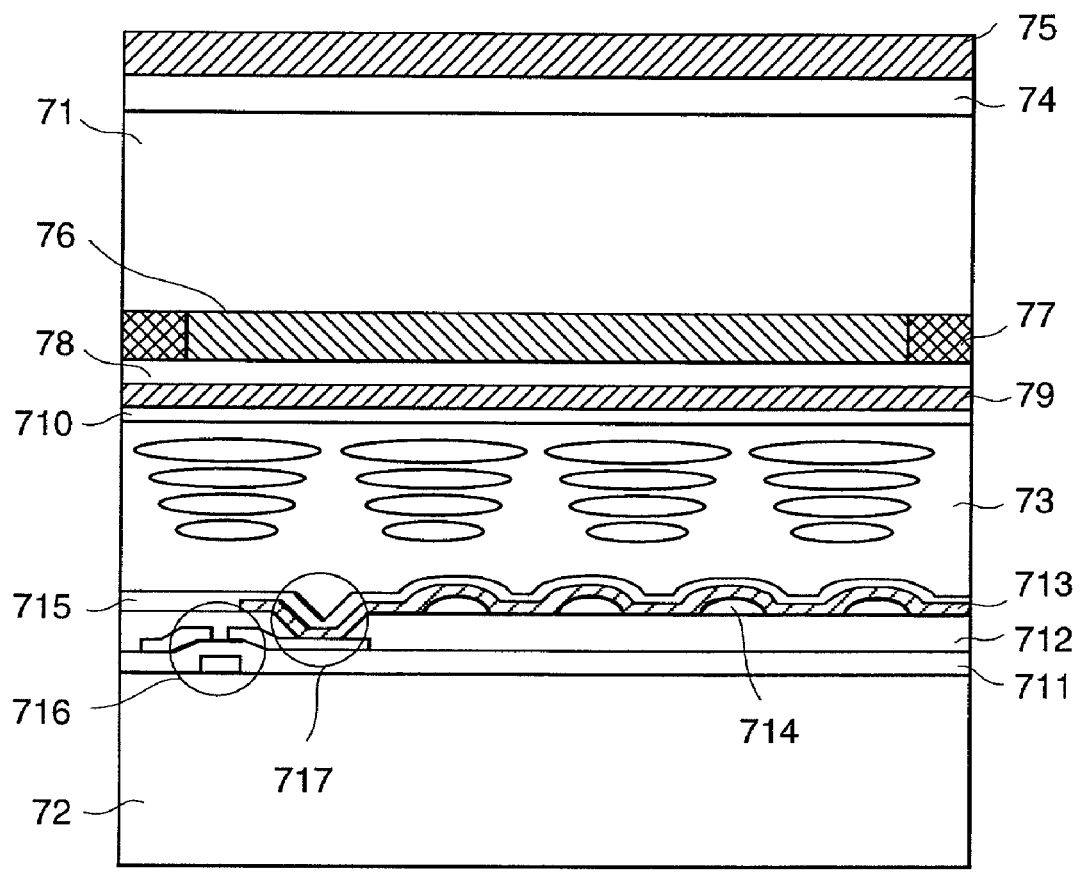

Referring now to FIG. 7, an exemplary LCD employing the thin film transistor of the present invention is shown. Note, although the LCD shown is a "reflection type" LCD, any LCD utilizing a thin film transistor of the present invention can be fabricated. Numeral 71 denotes an upper substrate, 72 a lower substrate, 73 a liquid crystal layer, 74 a phase plate, 75 a polarizing plate, 76 a color filter, 77 a black matrix, 78 a flattening layer, 79 a common electrode, 710 a first orientation film, 711 a first insulation film, 712 a second insulation film, 713 a light-diffusive reflective electrode, 714 a recess and projection forming layer, 715 a second orientation film, 716 a thin film transistor of the present invention, and numeral 717 denotes a through-hole.

The upper substrate 71 is provided on one side (upper side) thereof with the phase plate 74 and the polarizing plate 75, and is provided on the other side (lower side) thereof with a combination portion of the color filter 76 and the black matrix 77, the flattening layer 78, the common electrode 79 and the first orientation film 710. The lower substrate 72 is provided on one side (upper side) thereof with the first insulation film 711, the second insulation film 712, the recess and projection forming layer 714, the light-diffusive reflective electrode 713 and the second orientation film 715. The liquid crystal layer 73 is sandwiched between the other side (lower side) of the upper substrate 71 and the one side (upper side) of the lower substrate 72. The thin film transistor 716 is a channel etched type of the present invention, and is disposed on the one side (upper side) of the lower substrate 72, and electrodes of the thin film transistor 716 are conductively connected respectively to a scanning line (not shown), a signal line (not shown) and the light-diffusive reflective electrode 713. The scanning line and the signal line are members of a group of scanning lines and a group of signal lines which are disposed in parallel respectively, and the scanning line group and the signal line group are disposed orthogonally to each other, and being insulated from each other by the first insulation film 711. The signal lines and the light-diffusive reflective electrode 713 are insulated from each other by the second insulation film 712, while the light-diffusive reflective electrode 713 and the electrode of the thin film transistor 716 corresponding to each other are conductively connected to each other by the through-hole 717. The recess and projection forming layer 714 is disposed on the second insulation film 712, to give a recess-and-projection pattern to the light-diffusive reflective electrode 713 disposed on the recess and projection forming layer 714. The second orientation film 715 disposed on the light-diffusive reflective electrode 713 defines a liquid crystal orientation direction of the liquid crystal layer 73.

The upper substrate 71 is made, for example, of a borosilicate glass, and has a thickness of about 0.7 mm. The color filter 76 has a pattern of repeated stripes of red, green and blue transmission portions, and the black matrix 77, made of a resin, is provided at gaps between the pixels. Recesses and projections formed at the combination portion of the color filter 76 and the black matrix 77 are flattened by the flattening layer 78 which is made of a resin. The common electrode 79 is made, for example, of ITO (Indium Tin Oxide), and has a thickness of about 0.2 µm. The first orientation film 710 has a thickness of about 0.2 µm, for example.

The lower substrate 72 is made of, for example, the same borosilicate glass as the upper substrate 71, and has a thickness of about 0.7 mm. The second orientation film 715 has a thickness of 0.2 µm, for example. The signal lines and the scanning lines are made, for example, of chromium (Cr), and the first insulation film 711 is made, for example, of silicon nitride (SiN). The second insulation film 712 and the recess and projection forming layer 714 are made of organic materials. The recess and projection forming layer 714 are first formed in cylindrical form by photolithography and then formed in projected form by thermal softening. The recess and projection forming layer 714 is arranged randomly so as to eliminate coloration due to a light interference effect.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of fabricating a thin film transistor comprising the steps of: providing a gate over a substrate; providing a gate insulating layer over said gate and said substrate; providing an amorphous silicon layer having a first resistance over said gate insulating layer; providing an impurity on the surface of said amorphous silicon layer; forming a drain electrode and a source electrode separated by a channel region over a contact portion with said amorphous silicon layer; subsequently, removing said impurity from said channel region by exposing said channel region to hydrogen plasma and diffusing said impurity into said contact portion to form a contact layer within said amorphous silicon layer, wherein said contact layer has a second resistance lower than said first resistance; and removing the impurity formed over the amorphous silicon layer in the channel region between the drain and source electrodes while retaining the impurity over the amorphous silicon layer surface contacted with drain and source region, so that the drain and source regions become a contact layer.

2. The method of claim 1 wherein said contact layer contains a concentration of said impurity of at least 0.01%.

3. The method of claim 1,
wherein said diffusion of said impurity into said contact portion is performed by heat annealing.

4. The method of claim 1 wherein said impurity is phosphorus.

5. The method of claim 1 wherein said amorphous silicon layer is deposited to a thickness of about 150 nm–200 nm.

6. A method of fabricating a thin film transistor comprising the steps of: providing a gate over a substrate; providing a gate insulating layer over said gate and said substrate; providing an amorphous silicon layer having a first resistance over said gate insulating layer; providing an impurity over said amorphous silicon layer, wherein said amorphous silicon layer does not contain said impurity; etching said silicon layer utilizing a common photoresist to form a drain electrode and a source electrode separated by a channel region over a contact portion with said amorphous silicon layer; subsequently, removing said impurity from said channel region by exposing said channel region to hydrogen plasma and diffusing said impurity into said contact portion to form a contact layer within said amorphous silicon layer, wherein said contact layer has a second resistance lower than said first resistance; and removing the impurity formed over the amorphous silicon layer in the channel region between the drain and source electrodes while retaining the impurity over the amorphous silicon layer surface contacted with drain and source region, so that the drain and source regions become a contact layer.

7. The method of claim 6 wherein said contact layer contains a concentration of said impurity of at least 0.01%.

8. The method of claim 6 wherein said diffusion of said impurity into said contact region is performed by heat annealing.

9. The method of claim 6 wherein said impurity is phosphorus.

10. The method of claim 6 wherein said amorphous silicon layer is deposited to a thickness of about 150 nm–200 nm.

11. A method of fabricating a thin film transistor comprising the steps of: providing a gate over a substrate; providing a gate insulating layer over said gate and said substrate; providing an amorphous silicon layer having a first resistance over said gate insulating layer; providing an impurity on the surface of said amorphous silicon layer; providing a photoresist over said impurity and back exposing said photoresist utilizing said gate stack as a mask and developing a pattern substantially identical with that of said gate; removing said pattern and forming a drain electrode and a source electrode separated by a channel region over a contact portion with said amorphous silicon layer; subsequently, removing said impurity from said channel region by exposing said channel region to hydrogen plasma and diffusing said impurity into said contact portion to form a contact layer within said amorphous silicon layer, wherein said contact layer has a second resistance lower than said first resistance, and wherein essentially none of said impurity is diffused into said contact portion prior to said removing step; and removing the impurity formed over the amorphous silicon layer in the channel region between the drain and source electrodes while retaining the impurity over the amorphous silicon layer surface contacted with drain and source region, so that the drain and source regions become a contact layer.

12. The method of claim 11 wherein said contact layer contains a concentration of said impurity of at least 0.01%.

13. The method of claim 11 wherein said diffusion of said impurity into said contact region is performed by heat annealing.

14. The method of claim 11 wherein said impurity is phosphorus.

15. The method of claim 11 wherein said amorphous silicon layer is deposited to a thickness of about 150 nm–200 nm.

16. A method of fabricating a liquid crystal display (LCD) comprising the steps of: providing a plurality of thin film transistors arranged on a LCD substrate in a matrix form, each of said thin film transistors fabricated by the steps of providing a gate over a substrate; providing a gate insulating layer over said gate and said substrate; providing an amorphous silicon layer having a first resistance over said gate insulating layer; providing an impurity on the surface of said amorphous silicon layer; forming a drain electrode and a source electrode separated by a channel region over a contact portion with said amorphous silicon layer; subsequently, removing said impurity from said channel region by exposing said channel region to hydrogen plasma and diffusing said impurity into said contact portion to form a contact layer within said amorphous silicon layer, wherein said contact layer has a second resistance lower than said first resistance, and removing the impurity formed over the amorphous silicon layer in the channel region between the drain and source electrodes while retaining the impurity over the amorphous silicon layer surface contacted with drain and source region, so that the drain and source regions become a contact layer.

17. The method of claim 16 wherein said contact layer contains a concentration of said impurity of at least 0.01%.

18. The method of claim 16 wherein said diffusion of said impurity into said contact region is performed by heat annealing.

19. The method of claim 16 wherein said impurity is phosphorus.

20. The method of claim 16 wherein said amorphous silicon layer is deposited to a thickness of about 150 nm–200 nm.

21. A method of fabricating a liquid crystal display (LCD) comprising the steps of: providing a plurality of thin film transistors arranged on a LCD substrate in a matrix form, each of said thin film transistors fabricated by the steps of: providing a gate over a substrate; providing a gate insulating layer over said gate and said substrate; providing an amorphous silicon layer having a first resistance over said gate insulating layer; providing an impurity on the surface of said amorphous silicon layer, wherein said impurity does not diffuse into said amorphous silicon layer; etching said amorphous silicon layer utilizing a common photoresist to form a drain electrode and a source electrode separated by a channel region over a contact portion with said amorphous silicon layer; subsequently, removing said impurity from said channel region by exposing said channel region to hydrogen plasma and then diffusing said impurity into said contact portion to form a contact layer within said amorphous silicon layer, wherein said contact layer has a second resistance lower than said first resistance; and removing the impurity formed over the amorphous silicon layer in the channel region between the drain and source electrodes while retaining the impurity over the amorphous silicon layer surface contacted with drain and source region, so that the drain and source regions become a contact layer.

22. The method of claim 21 wherein said contact layer contains a concentration of said impurity of at least 0.01%.

23. The method of claim 21 wherein said diffusion of said impurity into said contact region is performed by heat annealing.

24. The method of claim 21 wherein said impurity is phosphorus.

25. The method of claim 21 wherein said amorphous silicon layer is deposited to a thickness of about 150 nm–200 nm.

26. A method of fabricating a liquid crystal display (LCD) comprising the steps of: providing a plurality of thin film transistors arranged on a LCD substrate in a matrix form, each of said thin film transistors fabricated by the steps of: providing a gate over a substrate; providing a gate insulating layer over said gate and said substrate; providing an amorphous silicon layer having a first resistance over said gate insulating layer; providing an impurity over said amorphous silicon layer, wherein said amorphous silicon layer does not contain said impurity; providing a photoresist over said impurity and back exposing said photoresist utilizing said gate stack as a mask and developing a pattern substantially identical with that of said gate; removing said pattern and forming a drain electrode and a source electrode separated by a channel region over a contact portion with said amorphous silicon layer; subsequently, removing said impurity from said channel region by exposing said channel region to hydrogen plasma and diffusing said impurity into said contact portion to form a contact layer within said amorphous silicon layer, wherein said contact layer has a second resistance lower than said first resistance; and removing the impurity formed over the amorphous silicon layer in the channel region between the drain and source electrodes while retaining the impurity over the amorphous silicon layer surface contacted with drain and source region, so that the drain and source regions become a contact layer.

27. The method of claim 26 wherein said contact layer contains a concentration of said impurity of at least 0.01%.

28. The method of claim 26 wherein said diffusion of said impurity into said contact region is performed by heat annealing.

29. The method of claim 26 wherein said impurity is phosphorus.

30. The method of claim 26 wherein said amorphous silicon layer is deposited to a thickness of about 150 nm–200 nm.

* * * * *